(12) United States Patent
Bae et al.

(10) Patent No.: US 10,199,405 B2
(45) Date of Patent: Feb. 5, 2019

(54) TRANSISTOR DISPLAY PANEL AND MANUFACTURING METHOD THEREOF

(71) Applicant: SAMSUNG DISPLAY CO., LTD., Yongin-si, Gyeonggi-do (KR)

(72) Inventors: Joon-Hwa Bae, Suwon-si (KR); Byoung Kwon Choo, Hwaseong-si (KR); Byung Hoon Kang, Hwaseong-si (KR); Woo Jin Cho, Yongin-si (KR); Hyun Jin Cho, Seoul (KR); Jun Hyuk Cheon, Seoul (KR); Jee-Hyun Lee, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/671,638

(22) Filed: Aug. 8, 2017

(65) Prior Publication Data

US 2018/0047762 A1  Feb. 15, 2018

(30) Foreign Application Priority Data

Aug. 12, 2016 (KR) .................. 10-2016-0103303

(51) Int. Cl.
*H01L 27/12* (2006.01)
*H01L 21/02* (2006.01)
(Continued)

(52) U.S. Cl.
CPC .... *H01L 27/1285* (2013.01); *H01L 21/02532* (2013.01); *H01L 21/02658* (2013.01);
(Continued)

(58) Field of Classification Search
CPC .......... H01L 27/1285; H01L 21/02658; H01L 29/66757; H01L 21/3212; H01L 21/31053;
(Continued)

(56) References Cited

U.S. PATENT DOCUMENTS

2006/0211181 A1  9/2006  Chung
2008/0085602 A1  4/2008  Seong et al.
(Continued)

FOREIGN PATENT DOCUMENTS

KR   10-2012-0112232 A   10/2012
KR   10-2013-0142679 A   12/2013

OTHER PUBLICATIONS

Extended European Search Report dated Jan. 26, 2018, of the corresponding European Patent Application No. 17185436.7.

*Primary Examiner* — Moin Rahman
(74) *Attorney, Agent, or Firm* — Lee & Morse, P.C.

(57) ABSTRACT

A method of manufacturing a transistor display panel and a transistor display panel, the method including forming a polycrystalline silicon layer on a substrate; forming an active layer by patterning the polycrystalline silicon layer; forming a first insulating layer covering the substrate and the active layer; exposing the active layer by polishing the first insulating layer using a polishing apparatus; and forming a second insulating layer that contacts the first insulating layer and the active layer, wherein exposing the active layer by polishing the first insulating layer includes coating a first slurry on a surface of the first insulating layer, the first slurry reducing a polishing rate of the active layer.

10 Claims, 21 Drawing Sheets

(51) Int. Cl.
*H01L 29/786* (2006.01)
*H01L 21/306* (2006.01)
*H01L 21/3105* (2006.01)
*H01L 21/321* (2006.01)
*H01L 29/66* (2006.01)
*H01L 21/768* (2006.01)

(52) U.S. Cl.
CPC .. *H01L 21/02697* (2013.01); *H01L 21/30625* (2013.01); *H01L 21/31053* (2013.01); *H01L 21/3212* (2013.01); *H01L 27/127* (2013.01); *H01L 27/1222* (2013.01); *H01L 29/66757* (2013.01); *H01L 29/7869* (2013.01); *H01L 29/78672* (2013.01); *H01L 29/78696* (2013.01); *H01L 21/02675* (2013.01); *H01L 21/76834* (2013.01)

(58) Field of Classification Search
CPC ........... H01L 21/30625; H01L 29/7869; H01L 27/127; H01L 21/02532; H01L 21/02697; H01L 29/78672; H01L 27/1222; H01L 29/78696; H01L 21/76834; H01L 21/02675
USPC ....... 438/136, 137, 156, 173, 192, 206, 212, 438/424, 427, 428, 591
See application file for complete search history.

(56) References Cited

U.S. PATENT DOCUMENTS

2008/0182392 A1 7/2008 Yeh et al.
2010/0270618 A1 10/2010 Takei et al.
2011/0108840 A1* 5/2011 Lee .................... H01L 27/1214
257/59

\* cited by examiner

TRANSISTOR DISPLAY PANEL AND MANUFACTURING METHOD THEREOF

CROSS-REFERENCE TO RELATED APPLICATION

Korean Patent Application No. 10-2016-0103303, filed on Aug. 12, 2016, in the Korean Intellectual Property Office, and entitled: "Transistor Display Panel and Manufacturing Method Thereof," is incorporated by reference herein in its entirety.

BACKGROUND

1. Field

Embodiments relate to a transistor display panel and a manufacturing method thereof.

2. Description of the Related Art

Amorphous silicon used in an active layer of a transistor may have low mobility of electrons, i.e., charge carriers. It may be difficult to mount a driving circuit using a transistor made of amorphous silicon on a substrate, and a driving circuit using a transistor including an active layer made of polycrystalline silicon may be mounted on a substrate.

A method of manufacturing such a polycrystalline silicon transistor under a low temperature condition may include Solid Phase Crystallization (SPC), Metal Induced Crystallization (MIC), Metal Induced Lateral Crystallization (MILC), Excimer Laser Annealing (ELA), etc. For example, in a manufacturing process of an organic light emitting diode (OLED) display or a liquid crystal display (LCD), ELA using a laser beam with high energy for the crystallization may be used.

The above information disclosed in this Background section is only for enhancement of understanding of the background of the invention and therefore it may contain information that does not form the prior art that is already known in this country to a person of ordinary skill in the art.

SUMMARY

Embodiments are directed to a transistor display panel and a manufacturing method thereof.

The embodiments may be realized by providing a method of manufacturing a transistor display panel, the method including forming a polycrystalline silicon layer on a substrate; forming an active layer by patterning the polycrystalline silicon layer; forming a first insulating layer covering the substrate and the active layer; exposing the active layer by polishing the first insulating layer using a polishing apparatus; and forming a second insulating layer that contacts the first insulating layer and the active layer, wherein exposing the active layer by polishing the first insulating layer includes coating a first slurry on a surface of the first insulating layer, the first slurry reducing a polishing rate of the active layer.

Exposing the active layer by polishing the first insulating layer may include removing a protrusion of the active layer to flatten the active layer.

The first slurry may include an abrasive and a polishing rate reducing agent, the polishing rate reducing agent reducing the polishing rate of the active layer.

The first slurry may include a hydrophobic reactant that is reactive with the active layer.

The manufacturing method of the transistor display panel may further include coating a hydrophobic reactant on the surface of the first insulating layer after coating the first slurry on the surface of the first insulating layer, the hydrophobic reactant being reactive with the active layer.

The polishing apparatus may include a polishing part that rotates and polishes an object, and a polishing controller that measures a frictional force change of the polishing part to control a rotational speed of the polishing part, and exposing the active layer by polishing the first insulating layer may include detecting, with the polishing controller, the rotational speed of the polishing part to measure the frictional force change of the polishing part, and stopping, with the polishing controller, rotation of the polishing part at a time point that the frictional force changes.

The manufacturing method of the transistor display panel may further include forming a gate electrode at a position overlapping the active layer on the second insulating layer, wherein a top surface of the first insulating layer and a top surface of the second insulating layer are parallel to a surface of the substrate.

A height of the active layer from the surface of the substrate may be higher than that of the first insulating layer from the surface of the substrate.

The manufacturing method of the transistor display panel may further include flattening the polycrystalline silicon layer by removing a protrusion of the polycrystalline silicon layer with the polishing apparatus.

Flattening the polycrystalline silicon layer may include coating a second slurry on a surface of the polycrystalline silicon layer such that the second slurry includes an abrasive that polishes the polycrystalline silicon layer.

The manufacturing method of the transistor display panel may further include forming a gate electrode at a position overlapping the active layer on the second insulating layer, wherein a top surface of the first insulating layer and a top surface of the second insulating layer are parallel to a surface of the substrate.

The embodiments may be realized by providing a transistor display panel including a substrate; an active layer on the substrate, the active layer including a polycrystalline silicon layer; a first insulating layer adjacent to the active layer; a second insulating layer contacting the active layer and the first insulating layer; and a gate electrode on the second insulating layer and overlapping the active layer, wherein a top surface of the first insulating layer and a top surface of the second insulating layer are parallel to a surface of the substrate, and a height of the active layer from the surface of the substrate is higher than that of the first insulating layer from the surface of the substrate.

A boundary portion dividing the first insulating layer and the second insulating layer may be between the first insulating layer and the second insulating layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
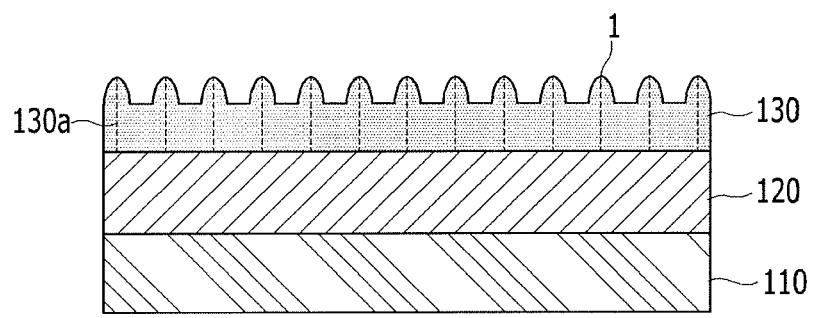
FIG. 1 illustrates a cross-sectional view for representing a first step of a manufacturing method of a transistor display panel according to an exemplary embodiment.

The present disclosure will be described more fully hereinafter with reference to the accompanying drawings, in which exemplary embodiments are shown. As those skilled in the art would realize, the described embodiments may be modified in various different ways, all without departing from the spirit or scope of the present disclosure.

Further, the size and thickness of each component shown in the drawings are arbitrarily shown for better understanding and ease of description, but the present disclosure is not limited thereto. Like reference numerals refer to like elements.

In the drawings, the thickness of layers, films, panels, regions, etc., may be exaggerated for clarity. For better understanding and ease of description, the thickness of some layers and areas may be exaggerated.

In addition, unless explicitly described to the contrary, the word "comprise" and variations such as "comprises," "includes," or "comprising" will be understood to imply the inclusion of stated elements but not the exclusion of any other elements. It will be understood that when an element such as a layer, film, region, or substrate is referred to as being "on" another element, it can be directly on the other element or intervening elements may also be present. An upper part of a target portion indicates an upper part or a lower part of the target portion, and it does not mean that the target portion is always positioned at the upper side based on a gravitational direction.

The phrase "on a plane" or in plan view means viewing the object portion from the top, and the phrase "on a cross-section" means viewing a cross-section of which the object portion is vertically cut from the side.

Further, the organic light emitting diode display is not restricted to a number of transistors and capacitors shown in the accompanying drawing, it may include a plurality of transistors and at least one capacitor for each pixel, and it may have various kinds of configurations by providing an additional wire or omitting an existing wire. Here, the pixel represents a minimum unit for displaying an image, and the organic light emitting diode display displays images through a plurality of pixels.

Hereinafter, a manufacturing method of a transistor display panel according to an exemplary embodiment will be described in detail with reference to FIG. 1 to FIG. 5.

Figure 2:
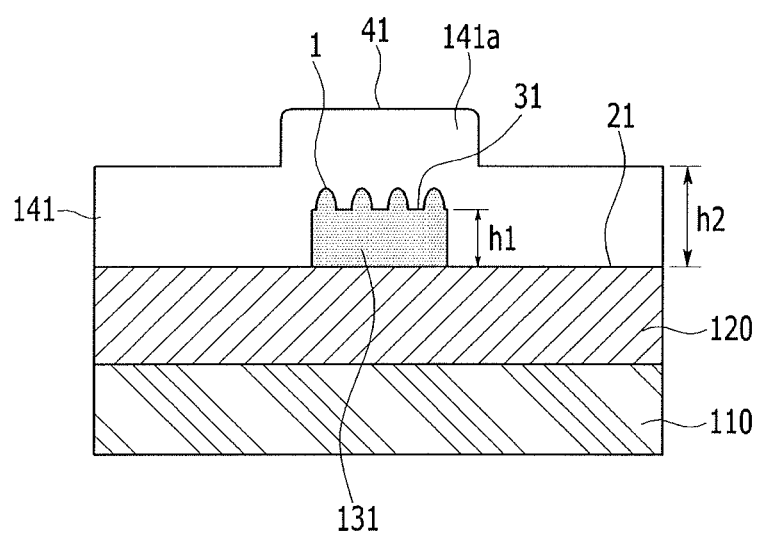
FIG. 2 illustrates a schematic view of a next step after that of FIG. 1.
Figure 3:
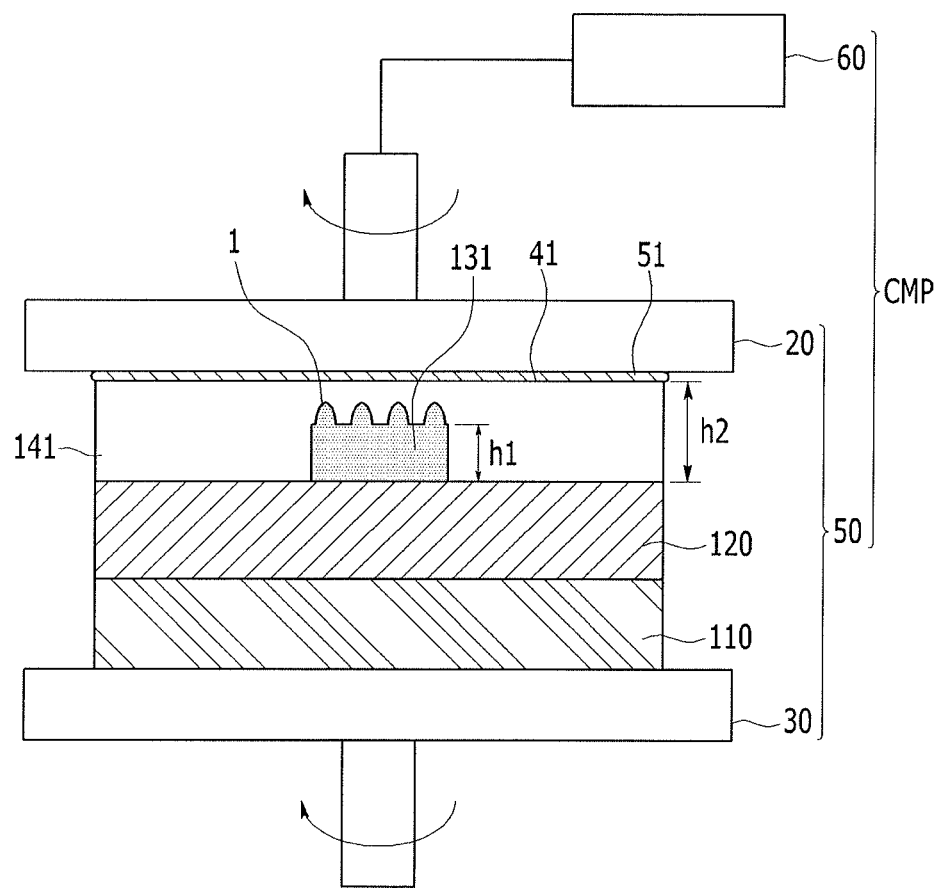
FIG. 3 illustrates a schematic view of a next step after that of FIG. 2.
Figure 4:
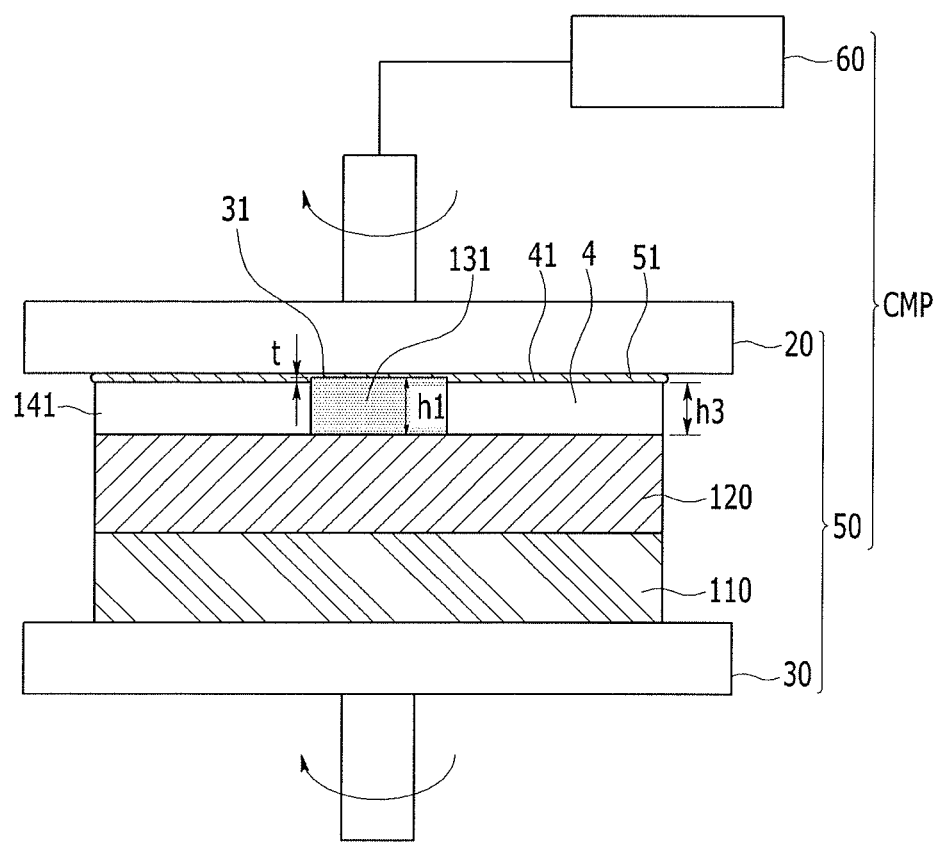
FIG. 4 illustrates a schematic view of a next step after that of FIG. 3.
Figure 5:
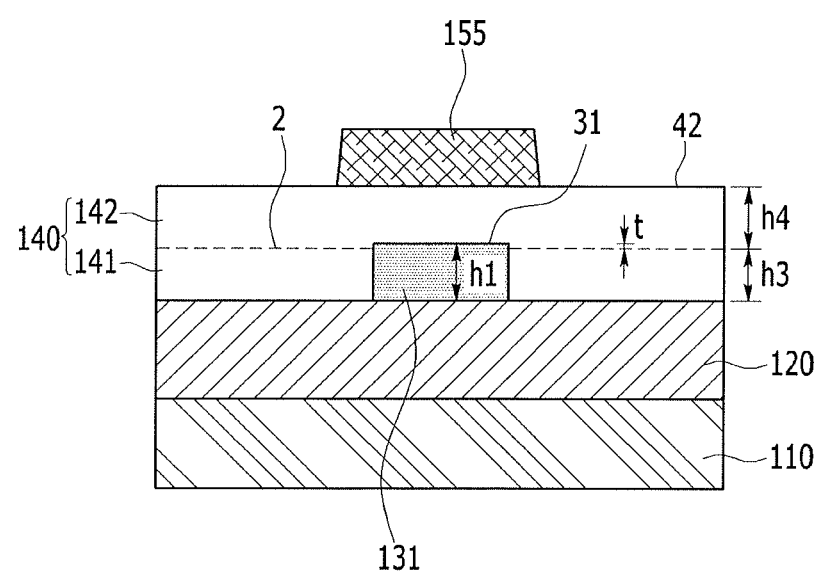
FIG. 5 illustrates a schematic view of a next step after that of FIG. 4.

FIG. 1 illustrates a cross-sectional view for representing a first step of a manufacturing method of a transistor display panel according to an exemplary embodiment, FIG. 2 illustrates a schematic view of a next step after that of FIG. 1, and FIG. 3 illustrates a schematic view of a next step after that of FIG. 2. FIG. 4 illustrates a schematic view of a next step after that of FIG. 3, and FIG. 5 illustrates a schematic view of a next step after that of FIG. 4.

As shown in FIG. 1, a buffer layer 120 and a polycrystalline silicon layer 130 may be sequentially disposed on a substrate 110.

The polycrystalline silicon layer 130, after an amorphous silicon layer is formed, may be crystalized and formed through a laser crystallization process. The amorphous silicon layer may be formed by low pressure chemical vapor deposition, atmospheric pressure chemical vapor deposition, plasma enhanced chemical vapor deposition (PECVD), sputtering, vacuum evaporation, or the like.

Protrusions I may be generated at grain boundaries 130a of a surface of the polycrystalline silicon layer 130. For example, the amorphous silicon layer melted by a laser beam may again be recrystallized based on the grain, thus the protrusion 1 may be generated at the grain boundary 130a corresponding to a boundary portion between the grains.

Next, as shown in FIG. 2, the polycrystalline silicon layer 130 may be patterned through a photolithography process to form an active layer 131 with a first height h1, and a first insulating layer 141 may be formed to cover the active layer 131 and the buffer layer 120. The first insulating layer 141 may have a second height h2.

The first height h1 is defined as a distance from a top surface 21 of the buffer layer 120 to a top surface 31 of the active layer 131. The protrusion 1 may protrude upward from the top surface 21 of the active layer 131. The second height h2 is defined as a distance from the top surface 21 of the buffer layer 120 to a top surface 41 of the first insulating layer 141. The first insulating layer 141 may include, e.g., a silicon oxide (SiOx) or a silicon nitride (SiNx). In this case, in a portion 141a of the first insulating layer 141 overlapping the active layer 131, the top surface 41 of the first insulating layer 141 may be raised by a height corresponding to the first height h1. Accordingly, the portion 141a of the first insulating layer 141 overlapping the active layer 131 may correspond to a protruding portion 141a, and the top surface 41 of the first insulating layer may have a step.

Next, as shown in FIG. 3 and FIG. 4, a planarization process may be performed by using a polishing apparatus (CMP) and performing a chemical mechanical polishing process.

As shown in FIG. 3, the planarization process for first removing the protruding portion 141a of the first insulating layer 141 may be performed with the polishing apparatus (CMP). Subsequently, as shown in FIG. 4, by continuously polishing the first insulating layer 141 with the polishing apparatus (CMP), the protrusion 1 of the active layer 131 shown in FIG. 3 may be exposed and, by continuously performing the planarization process, the protrusion 1 of the active layer 131 may be removed. In this case, a third height h3 of a lateral wall boundary 4 of the first insulating layer 141 contacting the active layer 131 may be lower than the first height h1 of the active layer 131. Accordingly, a step may be provided between the active layer 131 and the lateral wall boundary 4 of the first insulating layer 141.

In addition, as shown in FIG. 5, a second insulating layer 142 (that contacts the active layer 131 of which top surface 31 is exposed and the flattened first insulating layer 141 and covers them) may be formed.

Figure 6:
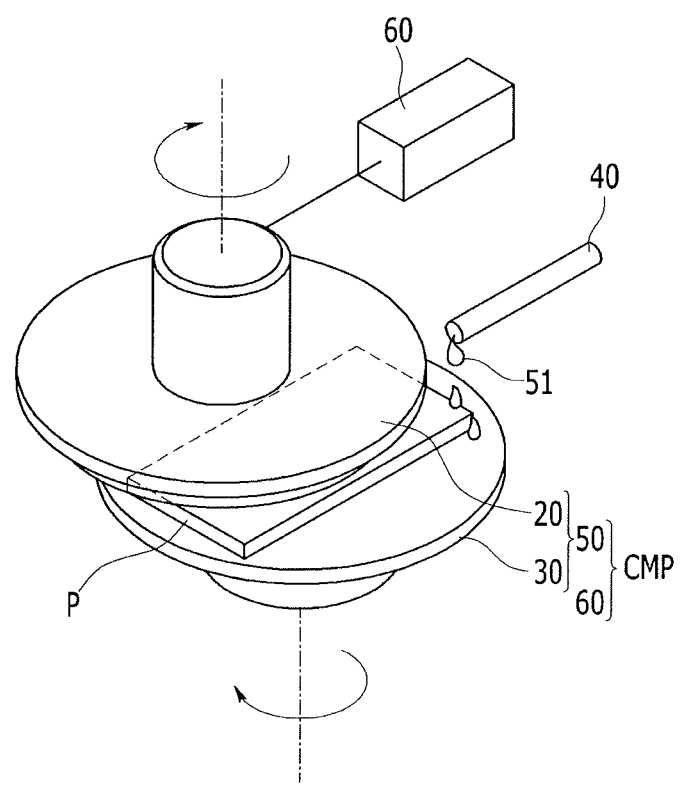
FIG. 6 illustrates a schematic perspective view of a polishing apparatus used in a manufacturing method of a transistor display panel according to an exemplary embodiment.

A structure of the polishing apparatus (CMP) will now be described in detail with reference to FIG. 3, FIG. 4, and FIG. 6. FIG. 6 illustrates a schematic perspective view of a polishing apparatus used in a manufacturing method of a transistor display panel according to an exemplary embodiment.

As shown in FIG. 6, the polishing apparatus (CMP) may include a polishing part 50 that rotates and polishes an object (P), and a polishing controller 60 that measures a frictional force change of the polishing part 50 to control a rotational speed of the polishing part 50. The polishing part 50 may include a first surface plate 20 and a second surface plate 30 facing each other. The object (P) may be positioned on the second surface plate 30. The first surface plate 20 and the second surface plate 30 may rotate to polish a surface of the object (P) interposed therebetween. In this case, a first slurry 51 may be supplied on the surface of the object (P) through a nozzle 40. The first slurry 51 may be a material to facilitate polishing the object (P).

The object (P) of FIG. 6 may correspond to the first insulating layer 141 stacked on the substrate 110 shown in FIG. 3 and FIG. 4.

In an implementation, the substrate 110 may be attached to an upper portion of the second surface plate 30 to perform the planarization process or the substrate 110 may be attached to a lower portion of the first surface plate 20 to perform the planarization process.

Figure 7:
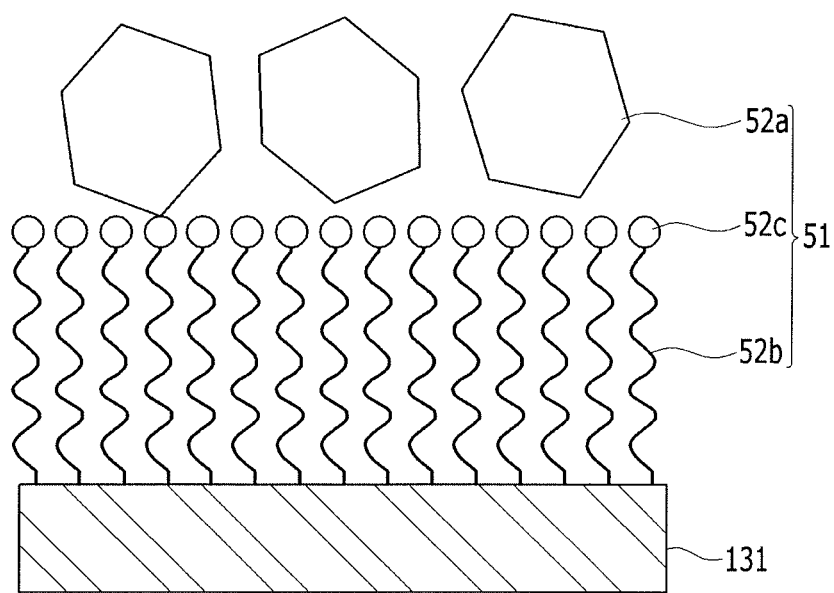
FIG. 7 illustrates a schematic view of a first slurry of a polishing apparatus used in a manufacturing method of a transistor display panel according to an exemplary embodiment.

FIG. 7 illustrates a schematic view of a first slurry of a polishing apparatus used in a manufacturing method of a transistor display panel according to an exemplary embodiment.

As shown in FIG. 7, the first slurry 51 may include abrasives 52a, hydrophobic reactants 52b that are easily combined with or that are reactive with or relative to the active layer 131, and a hydrophilic polishing rate reducing agent 52c (that reduces a polishing rate of the active layer 131). The abrasive 52a may include, e.g., silica ($SiO_2$), ceria ($CeO_2$), alumina ($Al_2O_3$), zirconia ($ZrO_2$), tin oxide ($SnO_2$), manganese oxide ($MnO_2$), etc.

The manufacturing method of the transistor display panel according to the exemplary embodiment will now be again described in detail with reference to FIG. 6 together with FIG. 3 to FIG. 5.

Referring to FIG. 3, the protruding portion 141a of the first insulating layer 141 may be removed by polishing the first insulating layer 141 with the polishing apparatus (CMP), and the top surface 41 of the first insulating layer 141 may be flattened.

Referring to FIG. 4, the protrusion 1 of the active layer 131 shown in FIG. 3 may be exposed by continuously polishing the first insulating layer 141 with the polishing apparatus (CMP). The protrusion 1 of the active layer 131 may then be removed by continuously performing the planarization process. In this case, the first slurry 51 between the active layer 131 and the polishing apparatus (CMP) may include the hydrophobic reactant 52b that is easily combined or reacted with the active layer 131, and the hydrophilic polishing rate reducing agent 52c combined to or at an end portion of the hydrophobic reactant 52b may be positioned over the active layer 131. Accordingly, while the polishing process is performed, although the polishing rate of the first insulating layer 141 is maintained, the polishing rate of the active layer 131 may decrease due to the hydrophilic polishing rate reducing agent 52c. In this case, the frictional force between the polishing part 50 of the polishing apparatus (CMP) and the active layer and first insulating layer 141 may be changed, and the rotational speed of the polishing part 50 of the polishing apparatus (CMP) may be changed.

In an implementation, the first slurry 51 may include the hydrophobic reactant 52b or the first slurry 51 may not contain the hydrophobic reactant 52b. For example, after coating the first slurry that does not contain the hydrophobic reactant 52b on a surface of the first insulating layer, the hydrophobic reactant may be separately coated on the surface of the first insulating layer. For example, the hydrophilic polishing rate reducing agent 52c contained in the first slurry may react with the hydrophobic reactant such that the hydrophilic polishing rate reducing agent 52c is combined to or at the end portion of the hydrophobic reactant. Accordingly, while the polishing process is performed, although the polishing rate of the first insulating layer 141 is maintained, the polishing rate of the active layer 131 may decrease due to the hydrophilic polishing rate reducing agent 52c.

The polishing controller 60 shown in FIG. 6 may detect the rotational speed change of the polishing part 50 to measure the frictional force change of the polishing part 50. Then, the polishing controller 60 may automatically stop the rotation of the polishing part 50 when the frictional force change occurs. Accordingly, only the protrusion 1 of the active layer 131 may be removed and the active layer 131 may no longer be polished, and thus the first height h1 of the active layer 131 may be maintained. However, the top surface 41 of the first insulating layer 141 may be partially removed. Accordingly, after the planarization process of the first insulating layer 141 is completed, the third height h3 (refer to FIG. 4 and FIG. 5) of the first insulating layer 141 may be lower than that first height h1 of the active layer 131. In an implementation, a difference (t) between the third height h3 and the first height h1 may be equal to or less than about 10 nm. For example, the first insulating layer 141 (of which protruding portion 141a is removed) may be flattened to have no step. A root-mean-square (RMS) of roughness of the active layer 131 of which the protrusions 1 are removed may be about 1 nm to about 3 nm. Maintaining the RMS of roughness of the surface of the active layer 131 at about 1 nm or greater helps ensure that complicated and precise equipment is not required to implement, thus helping to prevent an undesirable increase in manufacturing costs. In addition, maintaining the RMS of roughness of the surface of the active layer 131 at about 3 nm or less may help ensure that protrusions and depressions are not formed on the first insulating layer 141 covering the active layer 131.

Figure 8:
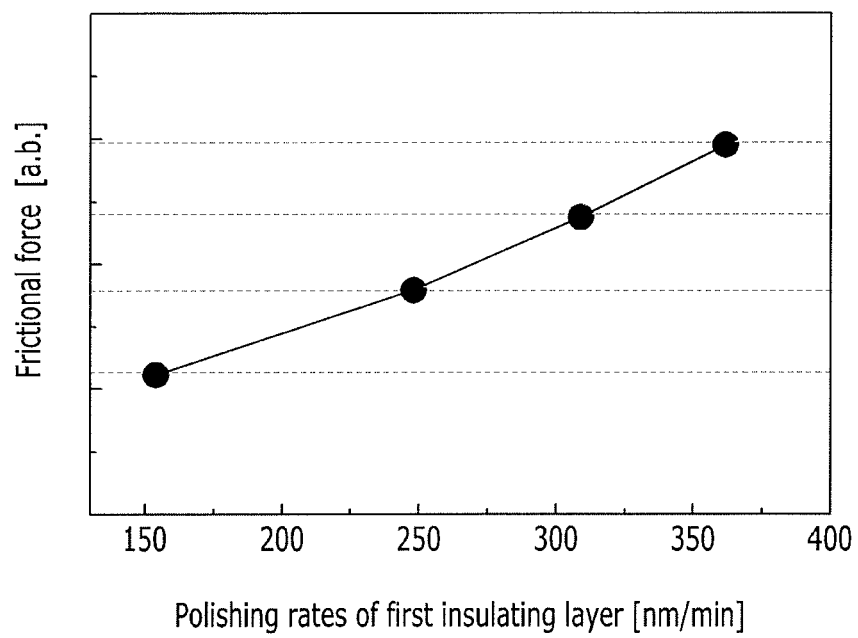
FIG. 8 illustrates a graph representing frictional forces with respect to polishing rates of a first insulating layer of a transistor display panel according to an exemplary embodiment.
Figure 9:
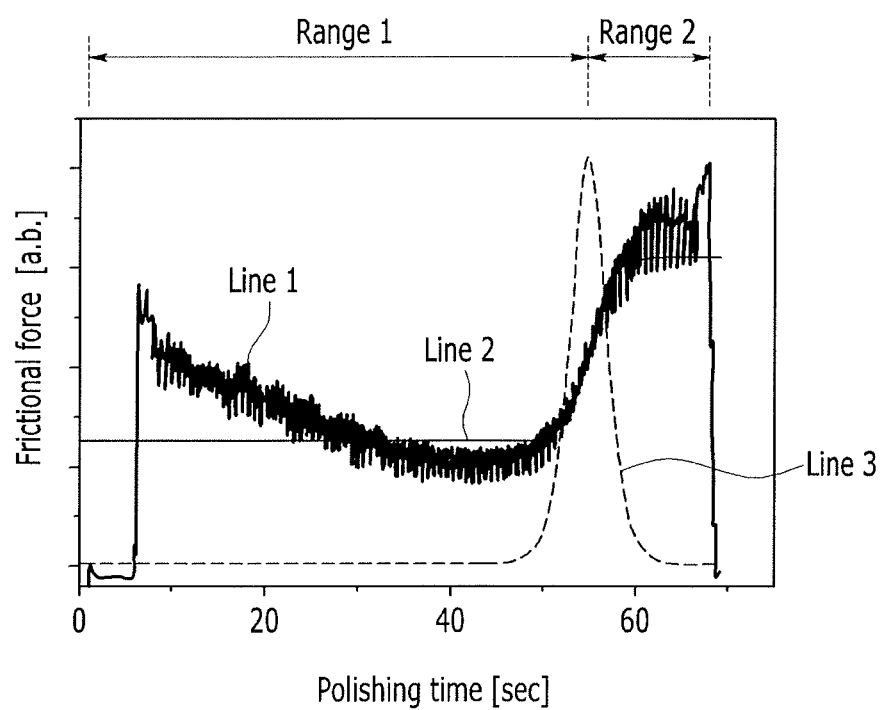
FIG. 9 illustrates a graph representing frictional forces with respect to polishing times of a polishing apparatus used in a manufacturing method of a transistor display panel according to an exemplary embodiment.

FIG. 8 illustrates a graph representing frictional forces with respect to polishing rates of a first insulating layer of a transistor display panel according to an exemplary embodiment, and FIG. 9 illustrates a graph representing frictional forces with respect to polishing times of a polishing apparatus used in a manufacturing method of a transistor display panel according to an exemplary embodiment.

As shown in FIG. 8, as the polishing rate of the first insulating layer 141 increases, the frictional force increases. In the case that the polishing rate is low, only when a difference between the polishing rates is greater than a predetermined value may the frictional force change therebetween be detected. It is possible to automatically stop the polishing apparatus by detecting such a time point of the frictional force change.

In FIG. 9, a line 1 represents actual frictional forces, a line 2 represents schematic frictional forces, and a line 3 represents a differential curve of the line 2. Further, in FIG. 9, a range 1 represents frictional force before the step of the first insulating layer 141 is removed, and a range 2 represents frictional force after the step of the first insulating layer 141. As shown in FIG. 9, the frictional force after the step of the first insulating layer 141 is removed may increase compared to the frictional force before the step of the first insulating layer 141 is removed. It is possible to automatically stop the rotation of the polishing part 50 of the polishing apparatus (CMP) by finding an inflection point at which the frictional force increases through line 3 to detect the time point of the frictional force change.

In an implementation, the polishing controller 60 shown in FIG. 6 may detect the rotational speed change of the polishing part 50 to automatically stop the rotation of the polishing part 50 or it may automatically stop the rotation of the polishing part 50 by detecting a change of the first insulating layer 141 through an optical measuring device.

Figure 10:
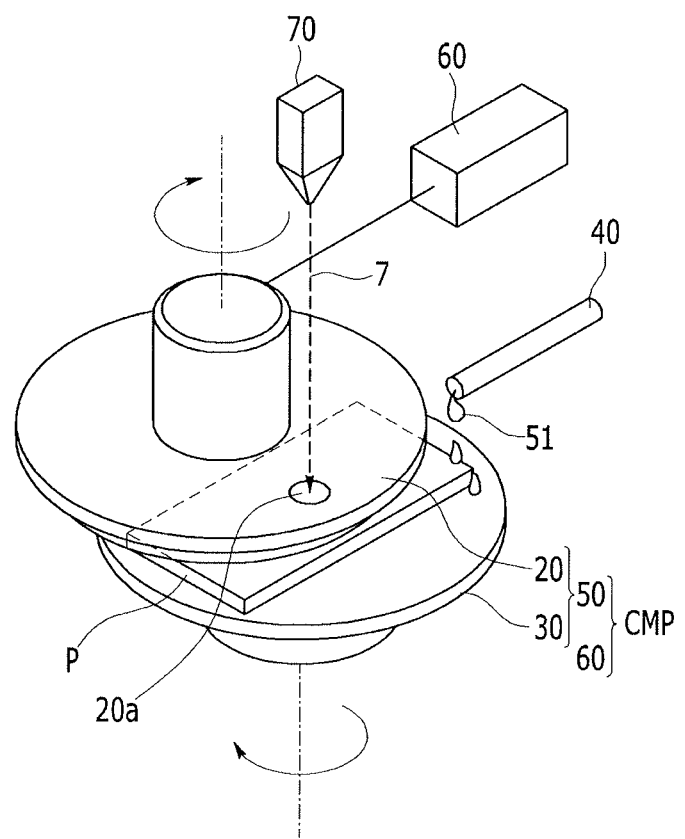
FIG. 10 illustrates a schematic view for explaining a method of stopping rotation of a polishing part through an optical measuring device.

FIG. 10 illustrates a schematic view for explaining a method of stopping rotation of a polishing part through an optical measuring device.

As shown in FIG. 10, an optical measuring device 70 may be positioned over the polishing apparatus (CMP) to be spaced apart from the polishing apparatus (CMP). The optical measuring device 70 may irradiate a laser beam 7 to the surface of the object (P) that is being polished, and then detects the laser beam 7 reflected from the object (P) to detect a change of the surface of the object (P). For example, the optical measuring device 70 may detect a thickness change of the object (P) or an illumination change of the surface of the object (P) to automatically stop the rotation of the polishing part 50.

A through-hole 20a that exposes the object (P) therebelow may be provided in the first surface plate 20. Accordingly, the laser beam 7 of the optical measuring device 70 may be irradiated to the surface of the object (P) and may be reflected therefrom, and then the reflected laser beam may be again incident to the optical measuring device 70.

As described above, and as shown in FIG. 5, the second insulating layer 142 covering the active layer 131 (of which top surface 31 was exposed) and the flattened first insulating layer 141 may be formed. Accordingly, the top surface 42 of the second insulating layer 142 does not substantially have a step. The top surface 41 of the first insulating layer 141 and the top surface 42 of the second insulating layer 142 may be parallel to the surface of the substrate 110. A boundary portion 2 dividing the first insulating layer 141 and the second insulating layer 142 may be between the first insulating layer 141 and the second insulating layer 142. The second insulating layer 142 may include, e.g., a silicon oxide (SiOx) or a silicon nitride (SiNx). In an implementation, the second insulating layer 142 may be made of various inorganic materials. A gate electrode 155 may be disposed on the second insulating layer 142. The first insulating layer 141 and the second insulating layer 142 may be positioned together between the active layer 131 and the gate electrode 155 to insulate the gate electrode 155, thus it may function as a gate insulating layer 140.

As described above, it is possible to reduce a number of manufacturing processes and manufacturing costs by simultaneously performing the planarization process of the active layer 131 and the planarization process of a part of the gate insulating layer 140.

In addition, by forming the gate insulating layer 140 (below the gate electrode 155) to substantially not have a step (e.g., to be flat or planar), it is possible to minimize characteristic deterioration of the transistor due to the step.

Further, by minimizing the step of the gate insulating layer 140 overlapping the active layer 131, the gate insulating layer 140 may be easily patterned. Accordingly, it is possible to easily manufacture a high resolution transistor display panel.

Figure 11:
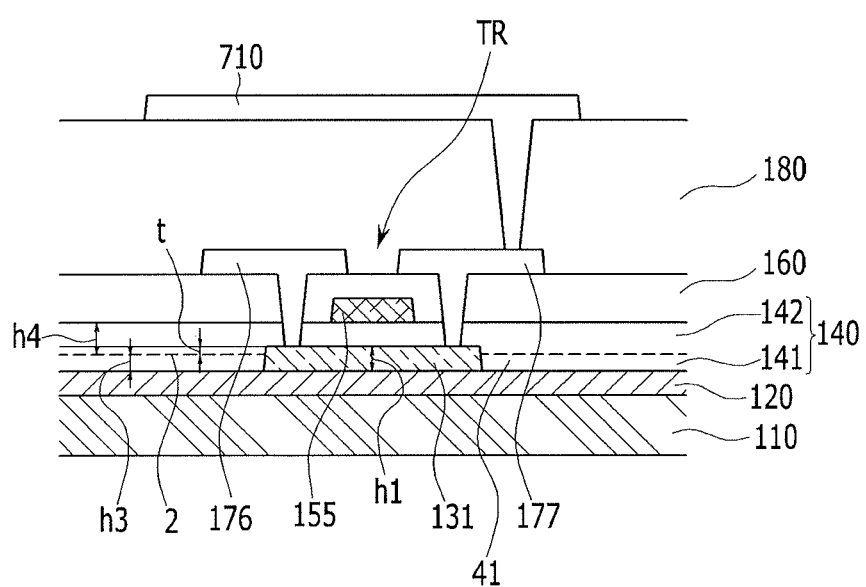
FIG. 11 illustrates a cross-sectional view of a transistor display panel according to an exemplary embodiment.

FIG. 11 illustrates a cross-sectional view of a transistor display panel according to an exemplary embodiment.

As shown in FIG. 11, an interlayer insulating layer 160 may be disposed on the gate insulating layer 140 and the gate electrode 155. Further, a source electrode 176 and a drain electrode 177 connected to the active layer 131 may be disposed on the interlayer insulating layer 160, thereby completing a transistor TR including the gate electrode 155, the active layer 131, the source electrode 176, and the drain electrode 177. Then, a passivation layer 180 covering the interlayer insulating layer 160, the source electrode 176, and the drain electrode 177 may be formed. Subsequently, a pixel electrode 710 connected to the drain electrode 177 may be disposed on the passivation layer 180, and the transistor display panel may be completed.

Hereinafter, the transistor display panel manufactured through the manufacturing method of the transistor display panel according to the exemplary embodiment will be described in detail with reference to FIG. 11.

As shown in FIG. 11, in the transistor display panel according to the exemplary embodiment, the buffer layer 120 may be positioned on the substrate 110.

The substrate 110 may be, e.g., a flexible insulating substrate made of glass, quartz, ceramic, plastic, or the like.

The buffer layer 120 may include an inorganic insulating material, e.g., a silicon oxide (SiOx), a silicon nitride (SiNx), aluminum oxide ($Al_2O_3$), hafnium oxide ($HfO_3$), or yttrium oxide ($Y_2O_3$). The buffer layer 120 may be a single layer or a multilayer. For example, when the buffer layer 120 is a double layer, a lower layer thereof may include a silicon nitride (SiNx) and an upper layer thereof may include a silicon oxide (SiOx). The buffer layer 120 may flatten a surface while preventing undesirable materials such as impurities or moisture from permeating therethrough.

The active layer 131 may be positioned on the buffer layer 120. The active layer 131 may include a channel region and a source area and a drain area (that are formed at opposite sides of the channel area by being doped with impurities). Herein, these impurities may be varied according to types of the transistor, and may include n-type or p-type impurities.

The active layer 131 may include, e.g., a polycrystalline silicon layer. In the active layer 131, protrusions may be removed through a polishing process. The active layer 131 may include a grain having a cross-section of a flat surface, and an RMS of roughness of the surface of the active layer 131 may be about 1 nm to about 3 nm. Complicated and precise equipment could otherwise be required to implement the RMS of roughness of the surface of the active layer 131 to be smaller than about 1 nm, thus manufacturing costs could increase. In addition, if the RMS of roughness of the surface of the active layer 131 were to be greater than 3 nm, undesirable protrusions and depressions could be formed on the first insulating layer 141 covering the active layer 131. As such, a height of the protrusion 1 of the active layer 131 may be minimized, thereby improving characteristics of the transistor including the active layer 131.

The gate insulating layer 140 may be positioned on the active layer 131. The gate insulating layer 140 may include the first insulating layer 141 having the third height h3 that is lower than the first height h1 of the active layer 131, and the second insulating layer 142 that contacts the first insulating layer 141 and the active layer 131 and may have a fourth height h4. The first insulating layer 141 and the second insulating layer 142 may be divided by the boundary portion 2. The third height h3 of the lateral wall boundary 4 of the first insulating layer 141 contacting the active layer 131 may be lower than the first height h1 of the active layer 131. The difference (t) between the third height h3 and the first height h1 may be equal to or less than about 10 nm. Accordingly, the top surface 42 of the second insulating layer 142 may not have a step, substantially. As such, the gate insulating layer 140 may not substantially have the step, thereby minimizing the characteristic deterioration of the transistor. The first insulating layer 141 and the second insulating layer 142 may include, e.g., a silicon oxide (SiOx) or a silicon nitride (SiNx).

The gate electrode 155 overlapping the active layer 131 may be positioned on the gate insulating layer 140. The interlayer insulating layer 160 may be positioned on the gate electrode 155. Similar to the gate insulating layer 140, the interlayer insulating layer 160 may include, e.g., a silicon oxide (SiOx) or a silicon nitride (SiNx).

The drain electrode 177 facing the source electrode 176 and the source electrode may be positioned on the interlayer insulating layer 160. The source electrode 176 and the drain electrode 177 may be connected to the active layer 131. The gate electrode 155, the active layer 131, the source electrode 176, and the drain electrode 177 form the transistor (TR) corresponding to a switching element.

The passivation layer 180 may be positioned on the source electrode 176 and the drain electrode 177. The passivation layer 180 may include a stacked layer of an organic material. e.g., a polyacrylic resin or a polyimide resin, or of the organic material and an inorganic material.

The pixel electrode 710 may be positioned on the passivation layer 180. The pixel electrode 710 may be formed of a transparent conductive material, e.g., indium tin oxide (ITO), indium zinc oxide (IZO), zinc oxide (ZnO), indium oxide ($In_2O_3$), etc., or a reflective metal, e.g., lithium, calcium, lithium fluoride/calcium, lithium fluoride/aluminum, aluminum, silver, magnesium, gold, etc. The pixel electrode 710 may be electrically connected to the drain electrode 177.

The transistor display panel may be used in display devices such as a liquid crystal display as well as an organic light emitting diode (OLED) display.

Hereinafter, an organic light emitting diode display including the transistor display panel will be described in detail with reference to FIG. 12 to FIG. 14.

Figure 12:
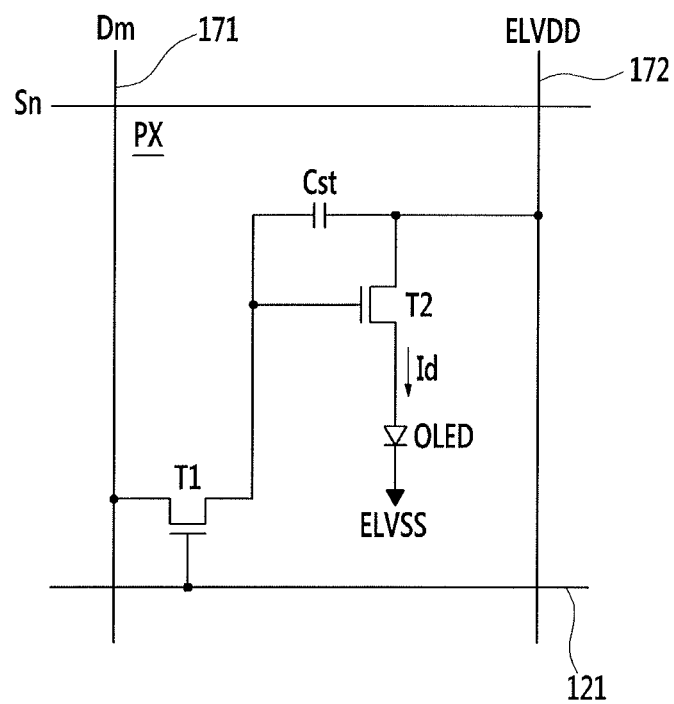
FIG. 12 illustrates an equivalent circuit diagram of a pixel of an organic light emitting diode display including a transistor display panel according to an exemplary embodiment.

FIG. 12 illustrates an equivalent circuit diagram of a pixel of an organic light emitting diode display including a transistor display panel according to an exemplary embodiment.

As shown in FIG. 12, the organic light emitting diode including the transistor display panel according to the exemplary embodiment may include a plurality of signal lines 121, 171, and 172, and a plurality of pixels PX that are connected thereto and arranged in an approximate matrix form. The signal lines 121, 171, and 172 may include a plurality of scan lines 121 for transmitting a scan signal (Sn), a plurality of data lines 171 for transmitting a data signal (Dm), and a plurality of driving voltage lines 172 for transmitting a driving voltage (ELVDD). The scan lines 121 may extend substantially in a row direction and are substantially parallel to each other, and the data lines 171 and driving voltage lines 172 may extend substantially in a column direction and are substantially parallel to each other. The respective pixels PX may include a switching transistor T1, a driving transistor T2, a storage capacitor Cst, and an organic light emitting diode (OLED).

The switching transistor T1 may include a control terminal, an input terminal, and an output terminal, and the control terminal may be connected to the scan line 121, the input terminal is connected to the data line 171, and the output terminal may be connected to the driving transistor T2. The switching transistor T1 may transmit the data signal applied to the data lines 171 to the driving transistor T2 in response to the scan signal applied to the scan lines 121.

The driving transistor T2 may include a control terminal, an input terminal, and an output terminal, and the control terminal may be connected to the switching transistor T1, the input terminal is connected to the driving voltage line, and the output terminal may be connected to the organic light emitting diode (OLED). The driving transistor T2 may allow an output current (Id), an amount of which varies according to a voltage applied between the control terminal and the output terminal, to flow.

The storage capacitor Cst may be connected between the control terminal and the input terminal of the driving transistor T2. The storage capacitor Cst may be charged by a data signal applied to the control terminal of the driving transistor T2, and maintains a charge even after the switching transistor T1 is turned off.

The organic light emitting diode (OLED) may include an anode connected to the output terminal of the driving transistor T2 and a cathode connected to the common voltage (ELVSS). The organic light emitting diode (OLED) may display an image by emitting light with variable intensity according to the output current (Id) of the driving transistor T2.

The switching transistor T1 and the driving transistor T2 may be n-channel or p-channel electric field effect transistors (FET). The transistors T1 and T2, the storage capacitor Cst, and the organic light emitting diode (OLED) may be variously connected.

Now, a detailed structure of the pixel of the organic light emitting diode display shown in FIG. 12 will be described in detail with reference to FIG. 13 and FIG. 14 together with FIG. 12.

Figure 13:
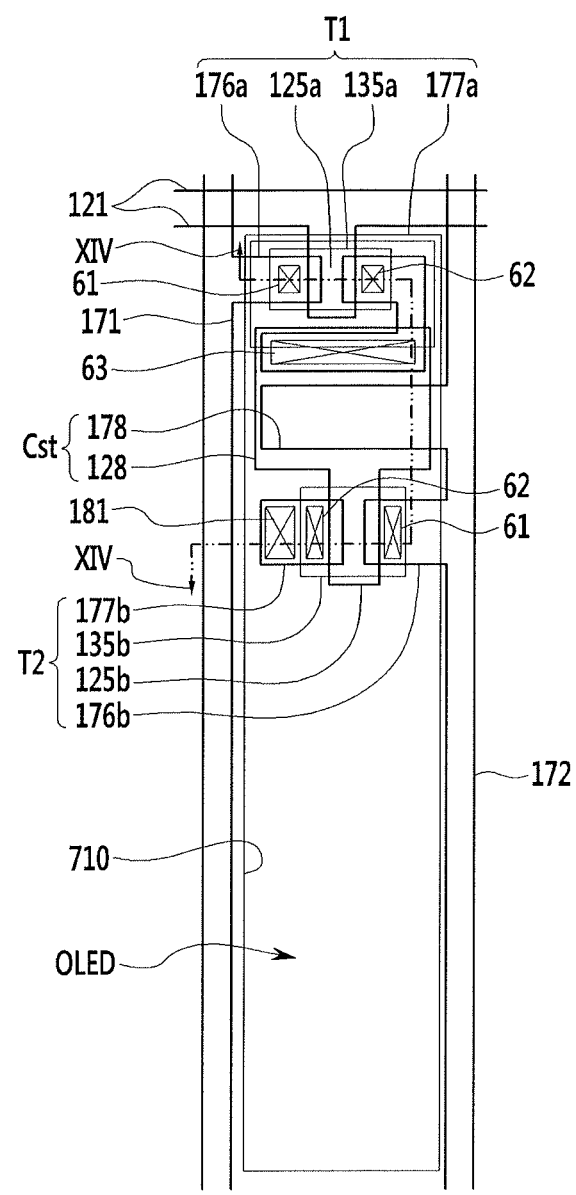
FIG. 13 illustrates a layout view of the pixel of the organic light emitting diode display of FIG. 12.
Figure 14:
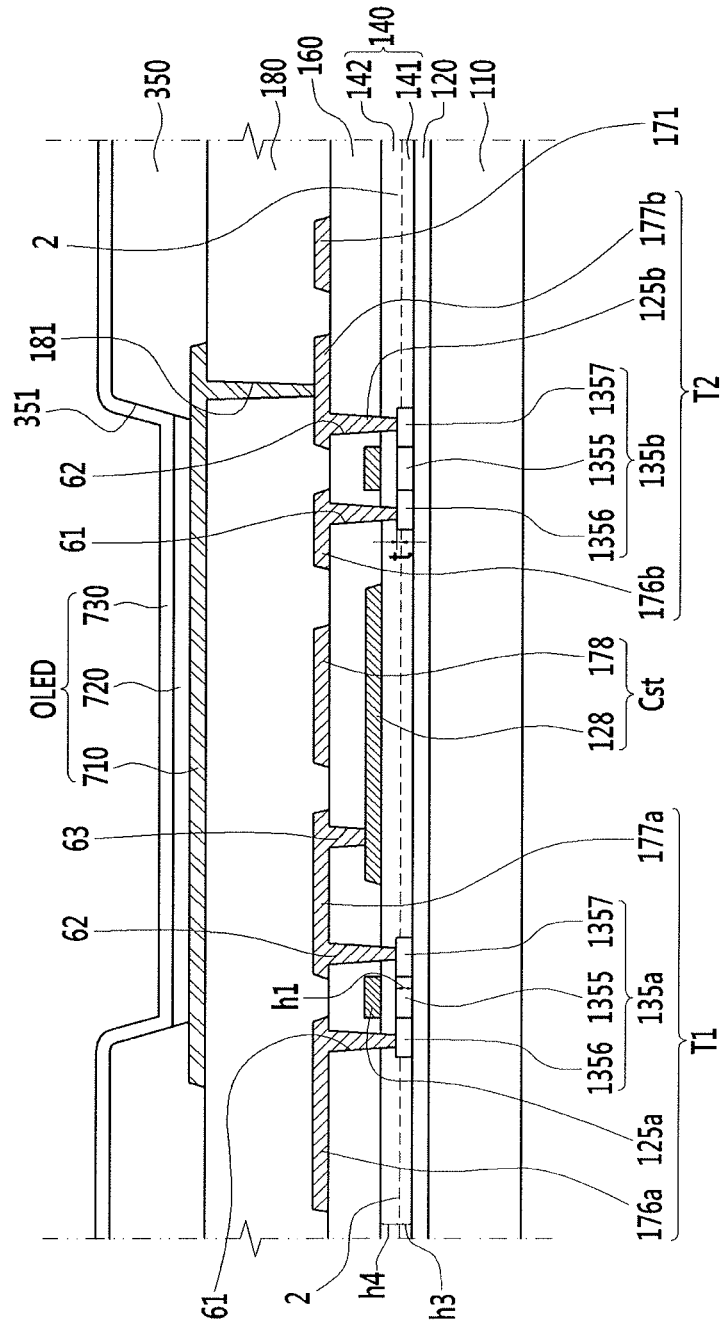
FIG. 14 illustrates a cross-sectional view taken along line XIV-XIV of FIG. 13.

FIG. 13 illustrates a layout view of the pixel of the organic light emitting diode display of FIG. 12, and FIG. 14 illustrates a cross-sectional view taken along line XIV-XIV of FIG. 13.

As shown in FIG. 13 and FIG. 14, the buffer layer 120 may be positioned on the substrate 110 of the organic light emitting diode display including the transistor display panel according to the exemplary embodiment. A switching active layer 135a and a driving active layer 135b may be separately positioned on the buffer layer 120. The switching active layer 135a and the driving active layer 135b may include a polycrystalline silicon layer.

The switching active layer 135a and the driving active layer 135b may respectively include a channel region 1355, and a source region 1356 and a drain region 1357 respectively formed at opposite sides of the channel region 1355. The channel regions 1355 of the switching active layer 135a and the driving active layer 135b may include a polycrystalline silicon in which no impurity is doped, e.g., an intrinsic semiconductor, and the source region 1356 and the drain region 1357s of the switching semiconductor layer 135a and the driving semiconductor layer 135b may include a polycrystalline silicon in which a conductive impurity is doped, e.g., an impurity semiconductor.

The gate insulating layer 140 may be positioned on the switching active layer 135a and the driving active layer 135b. The gate insulating layer 140 may include the first insulating layer 141 having the third height h3 that is lower than first height h1 of the switching active layer 135a and the driving active layer 135b, and the second insulating layer 142 that contacts the first insulating layer 141, the switching active layer 135a, and the driving active layer 135b and has the fourth height h4. The first insulating layer 141 and the second insulating layer 142 may be divided by or at the boundary portion 2. The third height h3 of the lateral wall boundary 4 of the first insulating layer 141 contacting the active layer 131 may be lower than the first height h1 of the active layer 131. The difference (t) between the third height h3 and the first height h1 may be equal to or less than about 10 nm. Accordingly, the top surface 42 of the second insulating layer 142 may not substantially have a step. As such, the gate insulating layer 140 may not substantially have the step, thereby minimizing the characteristic deterioration of the transistor.

The scan line 121, a driving gate electrode 125b, and a first storage capacitor plate 128 may be positioned on the gate insulating layer 140. The scan line 121 may extend in a horizontal direction to transmit the scan signal (Sn), and may include a switching gate electrode 125a protruding from the scan line 121 toward the switching active layer 135a. The driving gate electrode 125b may protrude from the first storage capacitor plate 128 to the driving active layer 135b. The switching gate electrode 125a and the driving gate electrode 125b may respectively overlap the channel region 1355.

The interlayer insulating layer 160 may be positioned on the scan line 121, the driving gate electrode 125b, and the first storage capacitor plate 128. The interlayer insulating layer 160 and the gate insulating layer 140 may include a source contact hole 61 and a drain contact hole 62 that respectively expose the source region 1356 and the drain region 1357, and a storage contact hole 63 that partially exposes the first storage capacitor plate 128.

A data line 171 having a switching source electrode 176a, a driving voltage line 172 having a driving source electrode 176b and a second storage capacitor plate 178, a switching drain electrode 177a connected to the first storage capacitor plate 128, and a driving drain electrode 177b may be positioned on the interlayer insulating layer 160.

The data line 171 transmits the data signal (Dm) and extends in a direction crossing the scan line 121. The driving voltage line 172 transmits the driving voltage (ELVDD) and extends in the same direction as the data line 171 while being spaced apart from the data line 171.

The switching source electrode 176a protrudes from the data line 171 toward to the switching active layer 135a, and the driving source electrode 176b protrudes from the driving voltage line 172 toward the driving active layer 135b. The switching source electrode 176a and the driving source electrode 176b may be respectively connected to the source region 1356 through the source contact hole 61. The switching drain electrode 177a faces the switching source electrode 176a, the driving drain electrode 177b faces the driving source electrode 176b, and the switching drain electrode 177a and the driving drain electrode 177b are respectively connected to the drain region 1357 through the drain contact hole 62.

The switching drain electrode 177a extends to be electrically connected to the first storage capacitor plate 128 and the driving gate electrode 125b through the storage contact hole 63 provided in the interlayer insulating layer 160.

The second storage capacitor plate 178 protrudes from the driving voltage line 172 to overlap the first storage capacitor plate 128. Accordingly, the first storage capacitor plate 128 and the second storage capacitor plate 178 may form the storage capacitor Cst using the interlayer insulating layer 160 as a dielectric material.

The switching active layer 135a, the switching gate electrode 125a, switching source electrode 176a, and the switching drain electrode 177a may form the switching transistor T1, and the driving active layer 135b, the driving gate electrode 125b, the driving source electrode 176b, and the driving drain electrode 177b form the driving transistor T2.

The passivation layer 180 may be positioned on the switching source electrode 176a, the driving source electrode 176b, the switching drain electrode 177a, and the driving drain electrode 177b.

The pixel electrode 710 may be positioned on the passivation layer 180. The pixel electrode 710 may be electrically connected to the driving drain electrode 177b of the driving transistor T2 through a contact hole 181 formed in the interlayer insulating layer 160 to become the anode of the organic light emitting diode (OLED).

A pixel defining layer 350 may be positioned on edge portions of the passivation layer 180 and the pixel electrode 710. The pixel defining layer 350 includes an opening 351 overlapping the pixel electrode 710.

An organic emission layer 720 may be positioned on the opening 351 of the pixel defining layer 350. The organic emission layer 720 may include a plurality of layers including at least one of an emission layer, a hole injection layer (HIL), a hole transporting layer (HTL), an electron transporting layer (ETL), and an electron injection layer (EIL). When the organic emission layer 720 includes all of the layers, the hole injection layer may be positioned on the pixel electrode 710 corresponding to an anode, and the hole transporting layer, the emission layer, the electron transporting layer, and the electron injection layer may be sequentially stacked. In an implementation, the emission layer may be made of organic materials or the emission layer may be made of inorganic materials.

A common electrode 730 may be positioned on the pixel defining layer 350 and the organic emission layer 720. The common electrode 730 may be made of a transparent conductive material, e.g., indium tin oxide (ITO), indium zinc oxide (IZO), zinc oxide (ZnO), indium oxide (In$_2$O$_3$), etc., or a reflective metal, e.g., lithium, calcium, lithium fluoride/calcium, lithium fluoride/aluminum, aluminum, silver, magnesium, gold, etc. The common electrode 730 may be the cathode of the organic light emitting diode (OLED). The pixel electrode 710, the organic emission layer 720, and the common electrode 730 form the organic light emitting diode (OLED).

In the exemplary embodiment illustrated in FIG. 13, a structure in which two transistors and one capacitor are included is illustrated. In an implementation, a various number of transistors and capacitors may be included.

As illustrated in FIG. 1 to FIG. 5, the planarization process of the active layer and the planarization process of the first gate insulating layer may be simultaneously performed. In an implementation, the planarization process of the active layer and the planarization process of the first gate insulating layer may be separately performed.

A manufacturing method of a transistor display panel according to another exemplary embodiment will now be described in detail with reference to FIG. 15 to FIG. 19.

Figure 15:
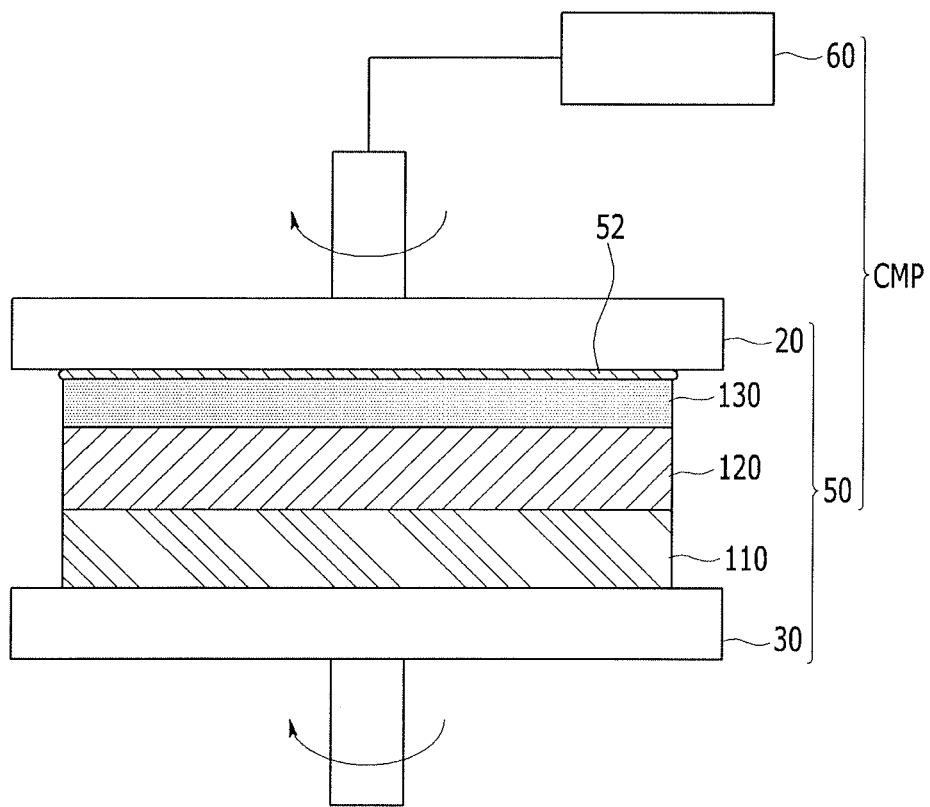
FIG. 15 illustrates a cross-sectional view for representing a first step of a manufacturing method of a transistor display panel according to another exemplary embodiment.
Figure 16:
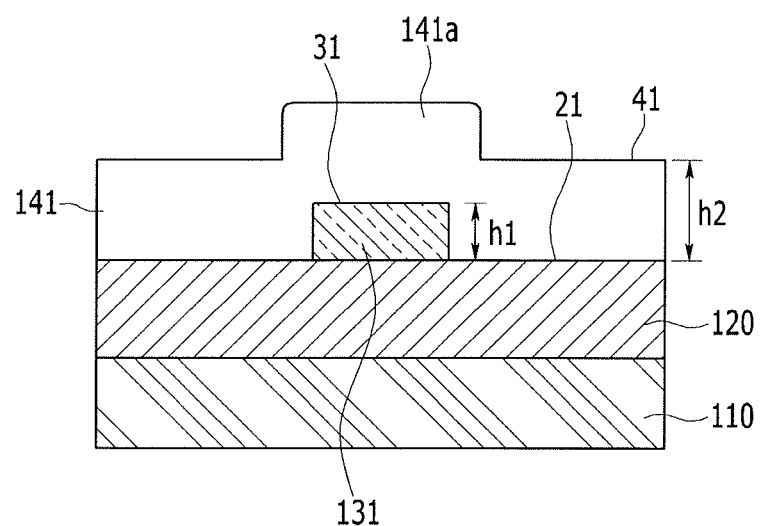
FIG. 16 illustrates a schematic view of a next step after that of FIG. 15.
Figure 17:
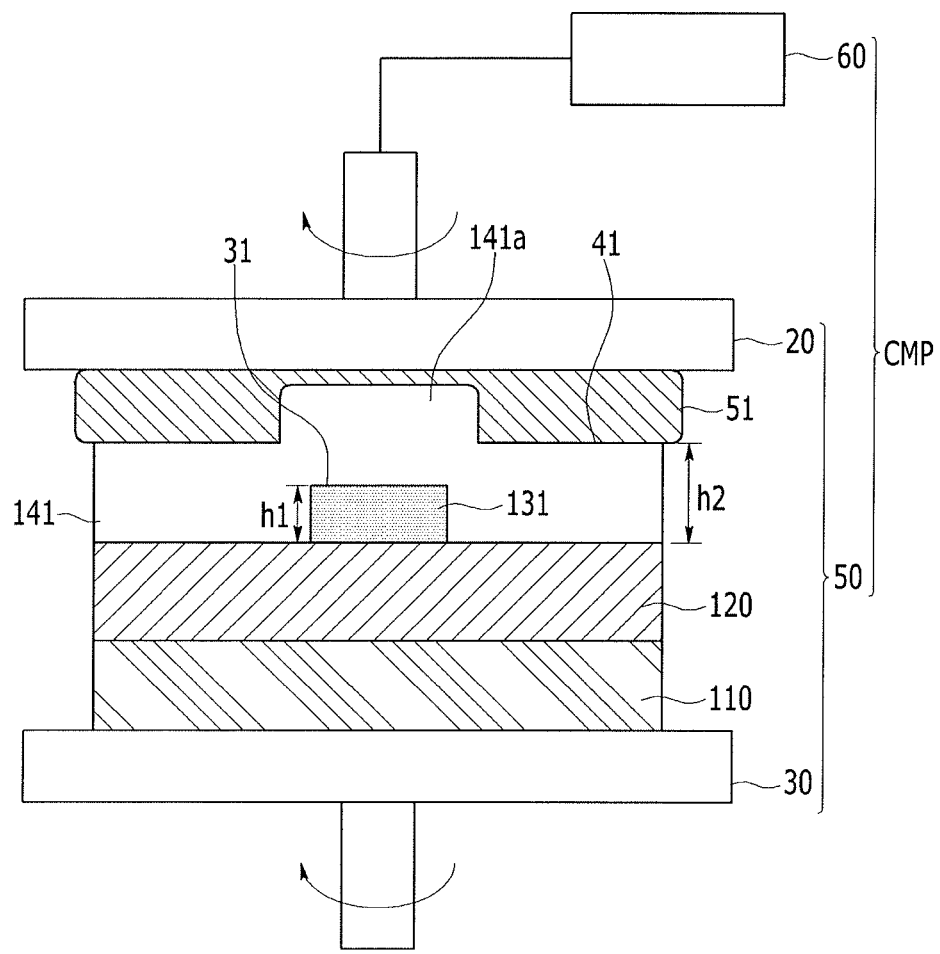
FIG. 17 illustrates a schematic view of a next step after that of FIG. 16.
Figure 18:
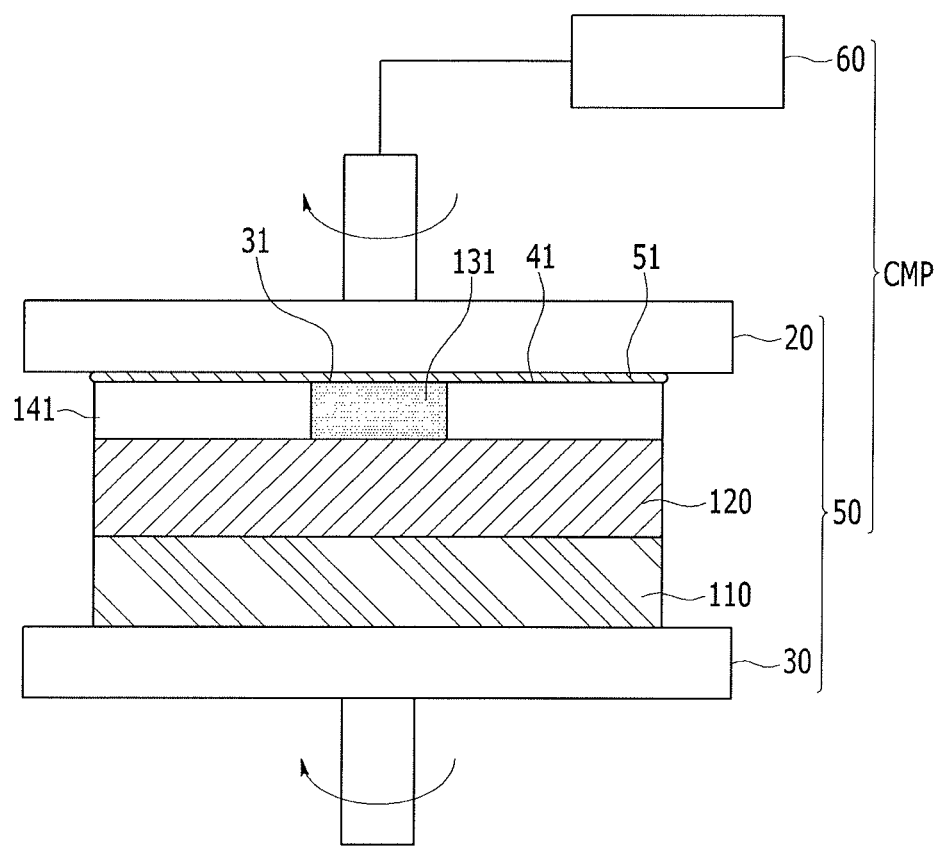
FIG. 18 illustrates a schematic view of a next step after that of FIG. 17.
Figure 19:
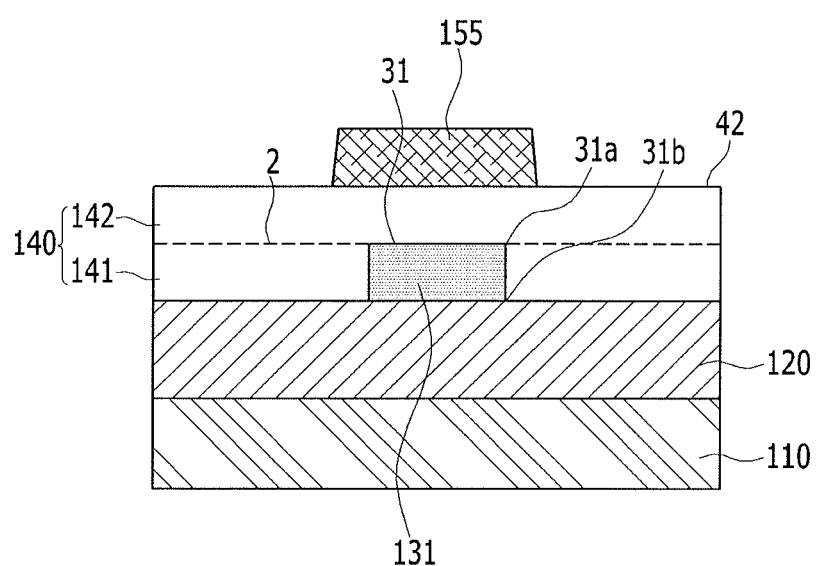
FIG. 19 illustrates a schematic view of a next step after that of FIG. 18.

FIG. 15 illustrates a cross-sectional view for representing a, first step of a manufacturing method of a transistor display panel according to another exemplary embodiment, FIG. 16 illustrates a schematic view of a next step after that of FIG. 15, and FIG. 17 illustrates a schematic view of a next step after that of FIG. 16. FIG. 18 illustrates a schematic view of a next step after that of FIG. 17, and FIG. 19 illustrates a schematic view of a next step after that of FIG. 18.

As shown in FIG. 15, in the manufacturing method of the transistor display panel according to another exemplary embodiment, the buffer layer 120 and the polycrystalline silicon layer 130 may be sequentially formed on the substrate 110, and then the planarization process of the polycrystalline silicon layer 130 may be performed using the polishing apparatus (CMP). The planarization process of the polycrystalline silicon layer 130 may be a process for polishing the protrusion 1 (refer to FIG. 1) of the surface of the polycrystalline silicon layer 130. In this case, a second slurry 52 between the polycrystalline silicon layer 130 and the polishing apparatus (CMP) may include the abrasive in which fine particles are uniformly dispersed for mechanical polishing, a reactant (such as an acid or a base for chemical reaction with the polished object), and ultra-pure water for dispersing and mixing the abrasive and the reactant. The abrasive may contain, e.g., silica (SiO$_2$) or ceria (CeO$_2$), alumina (Al$_2$O$_3$), zirconia (ZrO$_2$), tin oxide (SnO$_2$), manganese oxide (MnO$_2$), etc.

As such, by removing the protrusion 1 formed on the polycrystalline silicon layer 130 through the polishing apparatus (CMP), it is possible to help improve uniformity of the polycrystalline silicon layer 130, thereby improving the electrical conductivity thereof.

As shown in FIG. 16, the polycrystalline silicon layer 130 may be patterned through a photolithography process or the like to form the active layer 131, and then the first insulating layer 141 covering the active layer 131 and the buffer layer 120 may be formed.

The active layer 131 may have the first height h1, and the first insulating layer 141 has the second height h2. The first insulating layer 141 may include, e.g., a silicon oxide (SiOx) or a silicon nitride (SiNx). In this case, in the portion 141a of the first insulating layer 141 overlapping the active layer 131, the top surface 41 of the first insulating layer 141 may be raised by the height corresponding to the first height h1.

Accordingly, the portion 141a of the first insulating layer 141 overlapping the active layer 131 may correspond to the protruding portion 141a, and the top surface 41 of the first insulating layer 141 may have a step.

Next, as shown in FIG. 17, the first insulating layer 141 may be polished through the polishing apparatus (CMP). In this case, the first slurry 51 may be interposed between the first insulating layer 141 and the polishing apparatus (CMP) to perform the planarization process of the first insulating layer 141.

Subsequently, as shown in FIG. 18, the planarization process may be continuously performed through the polishing apparatus (CMP) to remove the protruding portion 141a, and the planarization process may be further continuously performed to expose the active layer 131. For example, the first slurry 51 may include the hydrophilic polishing rate reducing agent 52c to reduce a polishing rate of the active layer 131, and the polishing of the active layer 131 by the polishing apparatus (CMP) may be disturbed.

Next, as shown in FIG. 19, the second insulating layer 142 covering the active layer 131 of which the top surface 31 is exposed and the flattened first insulating layer 141 may be formed, and the gate electrode 155 may be formed on the second insulating layer 142. There may be no step between the first insulating layer 141 and the active layer 131, and the top surface 42 of the second insulating layer 142 may also not have a step. Between the first insulating layer 141 and the second insulating layer 142, the boundary portion 2 for dividing the first insulating layer 141 and the second insulating layer 142 may be formed or found. The second insulating layer 142 may include, e.g., a silicon oxide (SiOx) or a silicon nitride (SiNx). In an implementation, the second insulating layer 142 may be made of various inorganic materials. The first insulating layer 141 and the second insulating layer 142 may be positioned together between the active layer 131 and the gate electrode 155 to insulate the gate electrode 155, thus functioning as the gate insulating layer 140.

As such, by forming the gate insulating layer 140 below the gate electrode 155 to have no step, it is possible to help minimize characteristic deterioration of the transistor due to the step.

In addition, by removing the step of the gate insulating layer 140 overlapping the active layer 131, the gate insulating layer 140 may be easily patterned. Accordingly, it is possible to easily manufacture a high resolution transistor display panel.

Figure 20:
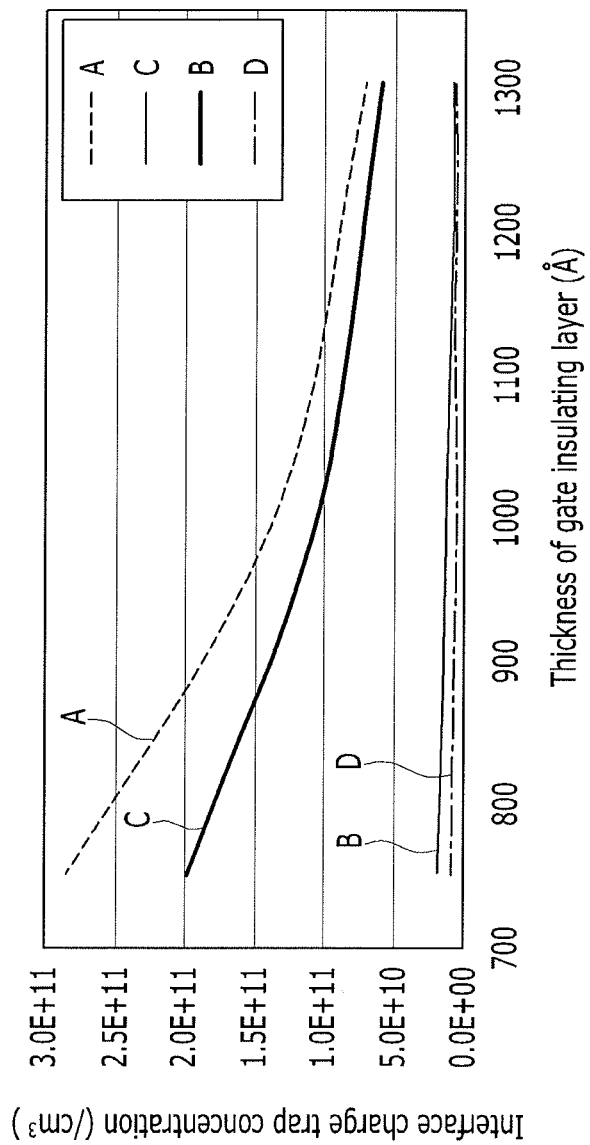
FIG. 20 illustrates a graph representing an interface charge trap concentration of an active layer of a transistor display panel according to another exemplary embodiment and interface charge trap concentrations of active layers of Comparative Examples.

FIG. 20 illustrates a graph representing an interface charge trap concentration of the active layer of the transistor display panel according to another exemplary embodiment and interface charge trap concentrations of active layers of Comparative Examples.

In FIG. 20, a line A and a line C respectively represent Comparative Examples in which a step is formed at the top surface of the gate insulating layer, and they represent interface charge trap concentrations of the active layer 131 with respect to thicknesses of the gate insulating layer. As shown in FIGS. 19 and 20, the line A represents the interface charge trap concentrations of an upper end portion 31a of the active layer 131, and the line C represents the interface charge trap concentrations of a lower end portion 31b of the active layer 131.

Line B and line D represent exemplary embodiments in which a step is not formed at the top surface of the gate insulating layer, and they represent interface charge trap concentrations of the active layer 131 with respect to thicknesses of the gate insulating layer. The line B represents the interface charge trap concentrations of the upper end portion 31a of the active layer 131, and the line D represents the interface charge trap concentrations of the lower end portion 31b of the active layer 131.

As shown in FIG. 20, it may be seen that the interface charge trap concentration of the active layer 131 of the exemplary embodiment (in which a step is not formed at the top surface 42 of the gate insulating layer 140) may be smaller than the interface charge trap concentration of the active layer 131 of the Comparative Examples (in which a step is formed at the top surface 42 of the gate insulating layer 140).

As such, by removing the step of the gate insulating layer 140 overlapping the active layer 131, it is possible to help reduce the interface charge trap concentration of the active layer 131, thereby preventing an abnormal electric field from being generated between the active layer 131 and the gate electrode 155. Accordingly, it is possible to help improve the characteristics of the transistor.

Figure 21:
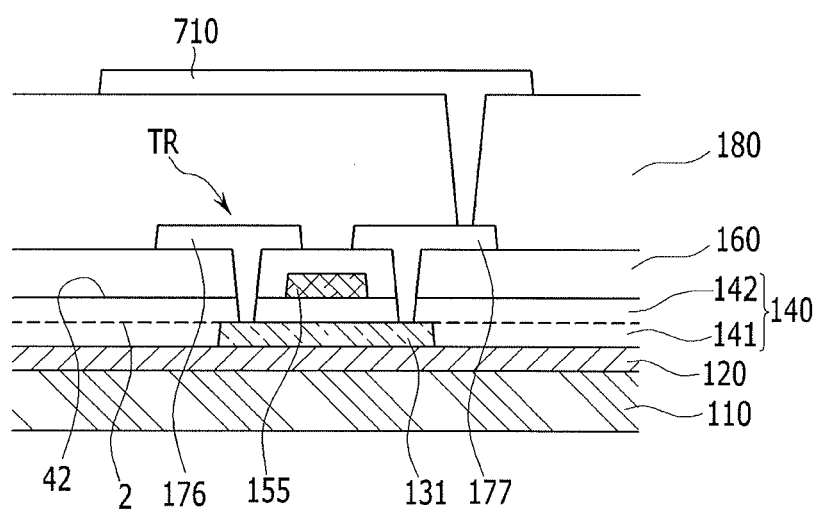
FIG. 21 illustrates a cross-sectional view of a transistor display panel according another exemplary embodiment.

FIG. 21 illustrates a cross-sectional view of the transistor display panel according another exemplary embodiment.

As shown in FIG. 21, the interlayer insulating layer 160 may be formed on the gate insulating layer 140 and the gate electrode 155. Then, the source electrode 176 and the drain electrode 177 connected to the active layer 131 may be formed on the interlayer insulating layer 160, such that the transistor (TR) including the gate electrode 155, the active layer 131, the source electrode 176, and the drain electrode 177 is completed. Next, the passivation layer 180 covering the interlayer insulating layer 160, the source electrode 176, and the drain electrode 177 may be formed. Then, the pixel electrode 710 connected to the drain electrode 177 may be formed on the passivation layer 180 to complete the transistor display panel.

Hereinafter, the transistor display panel manufactured by using the manufacturing method of the transistor display panel according to the exemplary embodiment will be described in detail with reference to FIG. 21.

The exemplary embodiment shown in FIG. 21 may be substantially the same as the exemplary embodiment shown in FIG. 11 except for the structure of the gate insulating layer, and thus a repeated description will be omitted.

As shown in FIG. 21, the gate insulating layer 140 may be positioned on the active layer 131. The gate insulating layer 140 may include the first insulating layer 141 and the second insulating layer 142 contacting the first insulating layer 141 and the active layer 131. The first insulating layer 141 and the second insulating layer 142 may be divided by or at the boundary portion 2. Accordingly, the boundary portion 2 between the first insulating layer 141 and the second insulating layer 142, and the top surface 42 of the second insulating layer 142, may have no step. As such, the gate insulating layer 140 overlapping the gate electrode 155 may have no step, and it is possible to help minimize characteristic deterioration of the transistor due to the step. The first insulating layer 141 and the second insulating layer 142 may include, e.g., a silicon oxide (SiOx) or a silicon nitride (SiNx).

By way of summation and review, when an active layer made of the amorphous silicon is crystallized by ELA, an unintended protrusion may be formed at a grain boundary of the active layer. Such a protrusion may affect characteristics of the active layer, and it may be difficult to manufacture a transistor with a desired characteristic.

According to the embodiments, it is possible to reduce a number of manufacturing processes and manufacturing costs by simultaneously performing the planarization process of the active layer and the planarization process of the gate insulating layer.

In addition, the protrusion of the active layer may be removed, and uniformity of the active layer may be improved, thereby improving electrical conductivity. Accordingly, it may be possible to improve the characteristics of the transistor.

Further, by removing the step of the gate insulating layer overlapped with the active layer, it may be possible to prevent an abnormal electric field from being generated between the active layer and the gate electrode. Accordingly, it is possible to improve the characteristics of the transistor.

Further, by removing the step of the gate insulating layer overlapped with the active layer, the gate insulating layer may be easily patterned. Accordingly, it is possible to easily manufacture the transistor display panel with a high resolution.

The embodiments may provide a transistor display panel exhibiting improved characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

51: first slurry, 52: second slurry, 110: substrate, 120: buffer layer, 130: polycrystalline silicon layer, 131: active layer, 141: first insulating layer, 142: second insulating layer, 155: gate electrode

What is claimed is:
1. A method of manufacturing a transistor display panel, the method comprising:
  forming a polycrystalline silicon layer on a substrate;
  forming an active layer by patterning the polycrystalline silicon layer;
  forming a first insulating layer covering the substrate and the active layer;
  exposing the active layer by polishing the first insulating layer using a polishing apparatus; and forming a second insulating layer that contacts the first insulating layer and the active layer, wherein exposing the active layer by polishing the first insulating layer includes coating a first slurry on a surface of the first insulating layer, the first slurry reducing a polishing rate of the active layer, wherein:
  the polishing apparatus includes:
  a polishing part that rotates and polishes an object, and a polishing controller that measures a frictional force change of the polishing part to control a rotational speed of the polishing part, and exposing the active layer by polishing the first insulating layer includes:
  detecting, with the polishing controller, the rotational speed of the polishing part to measure the frictional force change of the polishing part, and stopping, with the polishing controller, rotation of the polishing part at a time point that the frictional force changes.

2. The manufacturing method of the transistor display panel as claimed in claim 1, wherein exposing the active layer by polishing the first insulating layer includes removing a protrusion of the active layer to flatten the active layer.

3. The manufacturing method of the transistor display panel as claimed in claim 1, wherein the first slurry includes an abrasive and a polishing rate reducing agent, the polishing rate reducing agent reducing the polishing rate of the active layer.

4. The manufacturing method of the transistor display panel as claimed in claim 3, wherein the first slurry includes a hydrophobic reactant that is reactive with the active layer.

5. The manufacturing method of the transistor display panel as claimed in claim 3, further comprising coating a hydrophobic reactant on the surface of the first insulating layer after coating the first slurry on the surface of the first insulating layer, the hydrophobic reactant being reactive with the active layer.

6. The manufacturing method of the transistor display panel as claimed in claim 1, further comprising forming a gate electrode at a position overlapping the active layer on the second insulating layer, wherein a top surface of the first insulating layer and a top surface of the second insulating layer are parallel to a surface of the substrate.

7. The manufacturing method of the transistor display panel as claimed in claim 6, wherein a height of the active layer from the surface of the substrate is higher than that of the first insulating layer from the surface of the substrate.

8. The manufacturing method of the transistor display panel as claimed in claim 1, further comprising flattening the polycrystalline silicon layer by removing a protrusion of the polycrystalline silicon layer with the polishing apparatus.

9. The manufacturing method of the transistor display panel as claimed in claim 8, wherein flattening the polycrystalline silicon layer includes coating a second slurry on a surface of the polycrystalline silicon layer such that the second slurry includes an abrasive that polishes the polycrystalline silicon layer.

10. The manufacturing method of the transistor display panel as claimed in claim 8, further comprising forming a gate electrode at a position overlapping the active layer on the second insulating layer, wherein a top surface of the first insulating layer and a top surface of the second insulating layer are parallel to a surface of the substrate.

* * * * *